(12) United States Patent
Sun et al.

(10) Patent No.: US 9,512,242 B2
(45) Date of Patent: Dec. 6, 2016

(54) POLYMERIZABLE OLIGOMER AND PHOTORESIST COMPOSITION COMPRISING THE SAME

(71) Applicant: BOE TECHNOLOGY GROUP CO., LTD., Beijing (CN)

(72) Inventors: Wenwen Sun, Beijing (CN); Lin Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 298 days.

(21) Appl. No.: 14/348,662

(22) PCT Filed: Jun. 27, 2013

(86) PCT No.: PCT/CN2013/078199
§ 371 (c)(1),
(2) Date: Mar. 31, 2014

(87) PCT Pub. No.: WO2014/134889
PCT Pub. Date: Sep. 12, 2014

(65) Prior Publication Data
US 2016/0137758 A1  May 19, 2016

(30) Foreign Application Priority Data
Mar. 7, 2013 (CN) .......................... 2013 1 0072957

(51) Int. Cl.
*G03F 7/004* (2006.01)
*C08F 8/00* (2006.01)
(Continued)

(52) U.S. Cl.
CPC . *C08F 8/00* (2013.01); *C08F 8/14* (2013.01); *C08F 8/24* (2013.01); *C08F 220/00* (2013.01); *C08F 220/10* (2013.01); *C08F 220/20* (2013.01); *G03F 7/004* (2013.01);
(Continued)

(58) Field of Classification Search
CPC ...... G03F 7/004; G03F 7/038; G03F 7/0388; C08F 220/06; C08F 220/10; C08F 8/14; C08F 8/42
USPC ........ 430/270.1, 913, 281.1, 286.1; 525/298, 525/450, 44; 524/556
See application file for complete search history.

(56) References Cited

U.S. PATENT DOCUMENTS 4,228,232 A * 10/1980 Rousseau .............. C08F 291/18
430/271.1
4,282,301 A * 8/1981 Ohta ..................... G03F 7/0212
430/157
(Continued)

FOREIGN PATENT DOCUMENTS

| CN | 1754127 A | 3/2006 |
| CN | 101158810 A | 4/2008 |

(Continued)

OTHER PUBLICATIONS

Machine translation of CN 101200525 (no date).*
(Continued)

Primary Examiner — Amanda C Walke
(74) Attorney, Agent, or Firm — Ladas & Parry LLP

(57) ABSTRACT

The embodiments of the invention provide a polymerizable oligomer and a photoresist composition including the polymerizable oligomer, wherein the polymerizable oligomer contains a polymerizable double bond and a hydrophilic group.

19 Claims, 1 Drawing Sheet

(51) Int. Cl.
*C08F 220/10* (2006.01)
*C08F 8/14* (2006.01)
*C08F 8/24* (2006.01)
*G03F 7/038* (2006.01)
*C08F 220/00* (2006.01)
*G03F 7/027* (2006.01)
*C08F 220/20* (2006.01)
*G03F 7/028* (2006.01)
*C08F 220/02* (2006.01)
*C08F 220/06* (2006.01)
*C08F 220/18* (2006.01)

(52) U.S. Cl.
CPC ............ *G03F 7/027* (2013.01); *G03F 7/028* (2013.01); *G03F 7/038* (2013.01); *G03F 7/0388* (2013.01); *C08F 220/02* (2013.01); *C08F 220/06* (2013.01); *C08F 220/18* (2013.01)

(56) References Cited

U.S. PATENT DOCUMENTS 5,840,806 A * 11/1998 Komazaki ............ C08G 18/12
525/100

7,091,281 B2 * 8/2006 Kageishi ............ C09D 133/068
525/100
2004/0175653 A1 9/2004 Zuang et al.
2009/0087779 A1 * 4/2009 Mori ..................... B41C 1/1008
430/273.1

FOREIGN PATENT DOCUMENTS

| | | |
|---|---|---|
| CN | 101162365 A | 4/2008 |
| CN | 101200525 A | 6/2008 |
| CN | 103130955 A | 6/2013 |
| CN | 103145555 A | 6/2013 |

OTHER PUBLICATIONS

International Preliminary Report on Patentability issued Sep. 8, 2015; PCT/CN2013/078199.
Second Chinese Office Action dated Feb. 5, 2015; Appln. No. 201310072957.2.
International Search Report mailed Dec. 19, 2013; PCT/CN2013/078199.
First Chinese Office Action dated Jun. 26, 2014; Appln. No. 201310072957.2.

* cited by examiner

POLYMERIZABLE OLIGOMER AND PHOTORESIST COMPOSITION COMPRISING THE SAME

FIELD OF INVENTION

An embodiment of the invention relates to a polymerizable oligomer and a photoresist composition comprising the polymerizable oligomer.

BACKGROUND OF INVENTION

Currently, the colored filter is widely used in such products as colored liquid crystal display, colored fax machine, colored video recorder, and the like. In the process for manufacturing the colored filter, a light sensitive resin is coated on a glass substrate which is subsequently subjected to exposure, development to produce R, G and B pixel layer patterns.

During the development, the unexposed portion of the light sensitive resin will be washed off with an alkaline solution. During this process, an aggregation of pigment particles tends to occur in the exposed light sensitive resin, causing an uneven surface of the pixel layer and affecting the state of development. In order to solve the aforesaid technical problem, further studies and screening of the components of the photoresist composition are needed, which allow the photoresist to have excellent performance to satisfy the practical need.

SUMMARY OF INVENTION

An embodiment of the invention provides a polymerizable oligomer, use thereof, and a process for manufacturing the same, and a photoresist composition comprising the polymerizable oligomer, and a process for manufacturing the same.

An embodiment of the invention provides a polymerizable oligomer containing a polymerizable double bond and a hydrophilic group. For example, the monomers or compounds for synthesizing the polymerizable oligomer may comprise: one or more of a polymerizable double bond-containing organic ester monomer, a polymerizable double bond-containing organic acid monomer, and a polymerizable double bond-containing organic acyl chloride monomer; optionally, a compound containing a polymerizable double bond and a hydroxyl group; and a hydrophilic group-containing compound.

For example, the polymerizable oligomer is prepared from an oligomer (a), a compound containing a polymerizable double bond and a hydroxyl group, and a hydrophilic group-containing compound, wherein the oligomer (a) is polymerized from one or more of a polymerizable double bond-containing organic ester monomer, a polymerizable double bond-containing organic acid monomer and a polymerizable double bond-containing organic acyl chloride monomer.

For example, the polymerizable oligomer is prepared from a polymerizable double bond-containing oligomer (c) and a hydrophilic group-containing compound, wherein the polymerizable double bond-containing oligomer (c) is polymerized from one or more of a polymerizable double bond-containing organic ester monomer, a polymerizable double bond-containing organic acid monomer and a polymerizable double bond-containing organic acyl chloride monomer, and wherein at least one of the monomers participating in the polymerization contains two or more polymerizable double bonds, and the oligomer produced by the polymerization of the monomer(s) contains a polymerizable double bond group which is not involved in the polymerization.

For example, the oligomer (a) is polymerized from a polymerizable double bond-containing organic ester monomer, a polymerizable double bond-containing organic acid monomer and a polymerizable double bond-containing organic acyl chloride monomer in parts by weight of: the organic ester monomer: 6; the organic acid monomer: 1-3; and the organic acyl chloride monomer: 3-1.

For example, the compound containing a polymerizable double bond and a hydroxyl group may be selected from allyl alcohol, hydroxyethyl acrylate, hydroxyethyl methacrylate, hydroxypropyl acrylate or hydroxypropyl methacrylate.

For example, the hydrophilic group-containing compound may be one or more of a methoxy-containing compound, an ethoxy-containing compound and a hydroxyl-containing compound.

For example, the methoxy-containing compound may by one or more of (N,N-diethyl-3-aminopropyl)trimethoxysilane, 3-aminopropyltrimethoxysilane and bis(trimethoxysilylpropyl)amine.

For example, the ethoxy-containing compound may be one or more of dimethyldiethoxysilane, o-ethoxybenzoyl chloride, diethoxymethane, ethoxydiglycol, tetraethoxypropane, 3-aminopropyltriethoxysilane, 3-aminopropylmethyldiethoxysilane and N,N-bis(3-chloro-2-hydroxypropyl) aminopropyltriethoxysilane.

For example, the hydroxyl-containing compound may be one or more of pentaerythritol and hexylene glycol.

For example, the polymerizable double bond-containing organic ester monomer includes acrylate monomers.

For example, the acrylate monomers may be one or more of methyl acrylate, methyl methacrylate, ethyl methacrylate, propyl methacrylate, butyl methacrylate, isobutyl methacrylate and isopentyl acrylate.

For example, the polymerizable double bond-containing organic acid monomer includes acrylic acid monomers.

For example, the acrylic acid monomers may be one or more of acrylic acid, methacrylic acid, crotonic acid, cinnamic acid and α-methylcinnamic acid.

For example, the polymerizable double bond-containing organic acyl chloride monomer includes acroloyl chloride monomers.

For example, the acroloyl chloride monomers may be one or more of methacroloyl chloride, 2-ethylacroloyl chloride, acroloyl chloride and isobutylacroloyl chloride.

An embodiment of the invention provides a photoresist composition which comprises the polymerizable oligomer provided according to the embodiment of the invention.

For example, the photoresist composition further comprises an alkaline soluble resin, a photoinitiator and a solvent, wherein parts by weight of the components are: the polymerizable oligomer: 4-10; the alkaline soluble resin: 5-14.5; the photoinitiator: 1-5.5; and the solvent: 30-70.

For example, the photoresist composition further comprises, by weight of the photoresist composition, 0.2%-5% of an adjuvant, which may include one or more of a dispersing agent, a leveling agent and an anti-foaming agent.

A process for preparing the polymerizable oligomer according to the embodiment of the invention comprises:
synthesizing a polymerizable double bond-containing oligomer;
reacting the polymerizable double bond-containing oligomer with a hydrophilic group-containing compound to produce a polymerizable oligomer which contains a polymerizable double bond group and a hydrophilic group.

For example, the synthesizing a polymerizable double bond-containing oligomer comprises:

polymerizing one or more of a polymerizable double bond-containing organic ester monomer, a polymerizable double bond-containing organic acid monomer, and a polymerizable double bond-containing organic acyl chloride monomer to produce an oligomer (a);

reacting the oligomer (a) with a compound containing a polymerizable double bond and a hydroxyl group to produce a polymerizable double bond-containing oligomer.

For example, the synthesizing a polymerizable double bond-containing oligomer comprises:

One or more of a polymerizable double bond-containing organic ester monomer, a polymerizable double bond-containing organic acid monomer, and a polymerizable double bond-containing organic acyl chloride monomer are polymerized to form a polymerizable double bond-containing oligomer (c), wherein at least one of the monomers participating in the polymerization contains two or more polymerizable double bonds, and the oligomer produced by the polymerization of the monomer(s) contains a polymerizable double bond group which does not participate in the polymerization.

A process for preparing the photoresist composition according to the embodiment of the invention comprises: mixing a polymerizable oligomer, an alkaline soluble resin, a photoinitiator and a solvent, wherein the parts by weight of the components are: the polymerizable oligomer: 4-10; the alkaline soluble resin: 5-14.5; the photoinitiator: 1-5.5; and the solvent: 30-70.

BRIEF DESCRIPTION OF DRAWINGS

In order to more clearly illustrate the technical solution of the embodiment of invention or prior art, the Figures useful for describing the embodiments of the invention or the prior art are briefly introduced below. It is apparent that the Figures described below only represent some examples of the invention. A person of ordinary skill in the art can obtain other Figures from these Figures without resorting to inventive work.

DETAILED DESCRIPTION OF INVENTION

Figure 1:
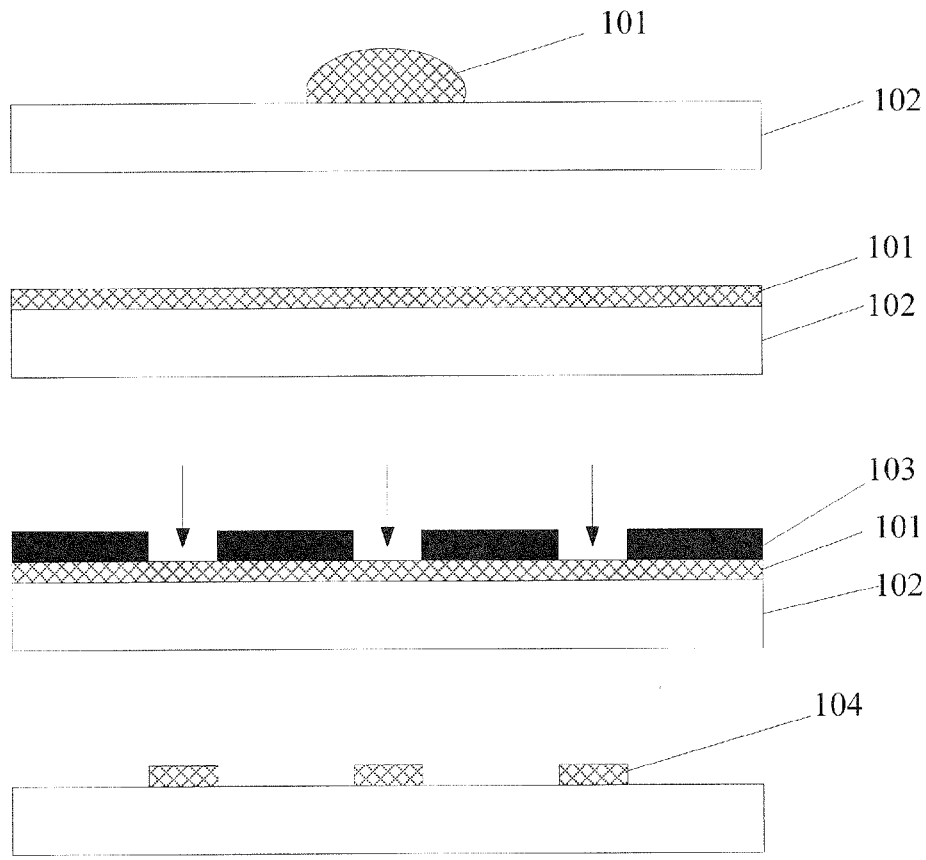
FIG. 1 is a diagram of the process for coating the photoresist composition according to one embodiment of the invention.

The technical solutions of the embodiments of the invention will be clearly and completely described with reference to the Figures of the invention. Apparently, the embodiments described are some embodiments rather than all embodiments of the present invention. Based on the embodiments of the invention described, any other embodiments obtainable by a person of ordinary skill in the art without resorting to inventive work will fall into the scope of the invention.

The polymerizable oligomer, use thereof, and process for manufacturing the same, the photoresist composition comprising the polymerizable oligomer, and a process for manufacturing the photoresist composition according to the embodiments of the invention will be described in details below with reference to the Figures.

The polymerizable oligomer of the embodiments of the invention means a low molecular weight oligomer that can be polymerized again. The polymerizable oligomer contains a group(s) that can participate in the polymerization, wherein the weight average molecular weight of the polymerizable oligomer may be 500-5000, for example 1000-2500. The polymerizable oligomer contains a polymerizable double bond and a hydrophilic group. Multiple schemes can be employed to provide the polymerizable oligomer with the polymerizable double bond and hydrophilic group. In the embodiment of the invention, the following two schemes are set forth to prepare the polymerizable oligomer which may comprise both the polymerizable double bond and the hydrophilic group.

Scheme I

The polymerizable oligomer may be prepared from an oligomer (a), a compound containing a polymerizable double bond and a hydroxyl group, and a hydrophilic group-containing compound.

The oligomer (a) can be polymerized from one or more of a polymerizable double bond-containing organic ester monomer, a polymerizable double bond-containing organic acid monomer and a polymerizable double bond-containing organic acyl chloride monomer.

The oligomer (a) polymerized from one or more of the aforesaid monomers has a side chain bearing an ester group, a carboxylic group or an acyl chloride group. The compound containing a polymerizable double bond and a hydroxyl group can react with the ester group, the carboxylic group or the acyl chloride group on the side chain of the oligomer (a) via the hydroxyl on it, allowing the introduction of the polymerizable double bond into the oligomer (a), thereby resulting in the polymerizable double bond-containing oligomer (b). The hydrophilic group-containing compound then reacts with the oligomer (b) to introduce a hydrophilic group into the oligomer (b), thereby providing the polymerizable oligomer of the present disclosure, which contains a polymerizable double bond and a hydrophilic group.

The hydrophilic group, for example, can be a carboxylic group, amino, quaternary ammonium group, an oxygen-containing group, hydroxyl, and the like, for improving the hydrophilic performance of the polymerizable oligomer. The hydrophilic group may be provided by a hydrophilic group-containing compound. The hydrophilic group-containing compound, for example, may include N,N-dimethylaminochlorodiphenylsilane, tris(dimethylamino)silane, trihexylazidosilane, 1,3-bis(trimethylsilyl)urea, or the like. The aforesaid compounds all have multiple hydrophilic groups, wherein one or more hydrophilic groups can be used to react with the ester group, the carboxylic group, or the acyl chloride on the side chain of the oligomer (b) so as to introduce the remaining hydrophilic groups of the compounds into the oligomer (b), and make the side chain of the oligomer (b) to contain the hydrophilic group, resulting in the polymerizable oligomer of the disclosure that contains an unsaturated double bond and a hydrophilic group.

In an embodiment of the invention, where the oligomer (a) contains a carboxylic group, the polymerizable oligomer of the disclosure can be prepared in the absence of the hydrophilic group-containing compound.

For example, the compound containing a polymerizable double bond and a hydroxyl group may be one or more of allyl alcohol, hydroxyethyl acrylate, hydroxyethyl methacrylate, hydroxypropyl acrylate or hydroxypropyl methacrylate. The hydroxyl in the aforesaid compounds reacts with the ester group, the carboxylic group, or the acyl chloride on the side chain of the oligomer (a) to introduce the polymerizable double bond. Of course, the compounds containing a polymerizable double bond and a hydroxyl groups set forth above are merely some examples of the invention, rather than limiting the scope of the invention. Other compounds that contain both the polymerizable double bond and the hydroxyl also may be used.

In the invention, any one of the monomers may be used to polymerize to form the oligomer (a), which will be a homopolymer. Alternatively, two or three of the monomers may be used to polymerize to form the oligomer (a), which will be a co-copolymer. For example, the oligomer (a) may be a copolymer polymerized from the following three monomers: a polymerizable double bond-containing organic ester monomer, a polymerizable double bond-containing organic acid monomer, and a polymerizable double bond-containing organic acyl chloride monomer, wherein parts by weight of each component may be: the organic ester monomer: 6; the organic acid monomer: 1-3; and the organic acyl chloride monomer: 3-1.

For example, the organic ester monomer, the organic acid monomer and the organic acyl chloride monomer participating in the polymerization may be selected from many materials. For example, the organic ester monomer may include acrylate monomers. For example, the acrylate monomers may be one or more of methyl acrylate, methyl methacrylate, ethyl methacrylate, propyl methacrylate, butyl methacrylate, isobutyl methacrylate and isopentyl acrylate. Of course, other types of organic esters may be used, such as butenoates. For example, the organic acid monomer may include acrylic acid monomers. The acrylic acid monomers may be one or more of acrylic acid, methacrylic acid, crotonic acid, cinnamic acid and α-methylcinnamic acid. For example, the organic acyl chloride monomer may include acroloyl chloride monomers. The acroloyl chloride monomers may be one or more of methacroloyl chloride, 2-ethylacroloyl chloride, acroloyl chloride and isobutylacroloyl chloride. It will be understood that the polymerizable double bond-containing organic monomers mentioned above are merely exemplary and not limited thereto. Any suitable organic monomer may be used in the invention.

Scheme II

The polymerizable oligomer of the present disclosure may be prepared from a polymerizable double bond-containing oligomer (c) and a hydrophilic group-containing compound.

The polymerizable double bond-containing oligomer (c) may be polymerized from one or more of a polymerizable double bond-containing organic ester monomer, a polymerizable double bond-containing organic acid monomer, and a polymerizable double bond-containing organic acyl chloride monomer, wherein at least one of the monomers participating in the polymerization contains two or more polymerizable double bonds, and at least one polymerizable double bond in the monomer that contains two or more polymerizable double bonds participates in the polymerization and at least one polymerizable double bond in the monomer does not participate in the polymerization.

Because one or more of the monomers participating in the polymerization contain two or more polymerizable double bonds, the oligomer (c) produced by the polymerization will have one or more polymerizable double bonds. The hydrophilic group-containing compound can subsequently react with the oligomer (c) that contains one or more polymerizable double bonds to produce the polymerizable oligomer of the present disclosure.

The organic ester monomer, organic acid monomer and organic acyl chloride monomer that contain two or more polymerizable double bonds may, for example be selected from one or more of triethylene glycol diacrylate (TEGDA), diethylene glycol diacrylate (DEGDA), or ethylene glycol dimethacrylate (EGDM).

It will be understood that, the aforesaid schemes are merely two exemplary schemes provided by the embodiment of the invention that produce the oligomer having the polymerizable double bond and the hydrophilic group. Other schemes may be employed to produce the oligomer having the aforesaid two groups and the invention is not thus limited to them.

The hydrophilic group in the polymerizable oligomer formed in the schemes of the embodiments of the invention and the compounds containing hydrophilic group may be described in reference to Scheme I as well as below in more details.

The polymerizable oligomer of the embodiments of the invention may be used in a photoresist composition. During the stage of development, the polymerizable oligomer in the photoresist composition can polymerize again via the polymerizable double bond under light, so that the exposed portion of the photoresist composition will not be washed off by an alkaline solution, whereas the unexposed portion will be washed off by the alkaline solution, thereby developing the desired pattern. Because the polymerizable oligomer bears a hydrophilic group on the side chains, the hydrophilicity of the polymerizable oligomer can be increased. After mixing with an alkaline resin to form the photoresist composition, the unexposed portion of the photoresist composition will be easily removed during the stage of development due to the hydrophilicity of the polymerizable oligomer, thus ensuring the smoothness of the photoresist surface, attenuating and mitigating the aggregation of pigments in the photoresist, and achieving an excellent development.

In the aforesaid two schemes, the hydrophilic group-containing compounds may be one or more of a methoxy-containing compound, an ethoxy-containing compound and a hydroxyl-containing compound. Methoxy, ethoxy, and hydroxy are common hydrophilic groups, and the high hydrophilicity thereof favors the hydrophilic performance of the polymerizable oligomer.

For example, in an embodiment of the invention, the methoxy-containing compound may be one or more of (N,N-diethyl-3-aminopropyl)trimethoxysilane, 3-aminopropyltrimethoxysilane, and bis(trimethoxysilylpropyl)amine.

For example, in a further embodiment of the invention, the ethoxy-containing compound may be one or more of dimethyldiethoxysilane, o-ethoxybenzoyl chloride, diethoxymethane, ethoxydiglycol, tetraethoxypropane, 3-aminopropyltriethoxysilane, 3-aminopropylmethyldiethoxysilane, and N,N-bis(3-chloro-2-hydroxypropyl)aminopropyltriethoxysilane.

For example, in a further embodiment of the invention, the hydroxyl-containing compound may be pentaerythritol, hexylene glycol, or combination thereof.

It will be understood that, the three hydrophilic groups as well as the compounds providing these hydrophilic groups enumerated above are merely examples. A person skilled in the art can also select other hydrophilic groups and compounds having such hydrophilic groups based on common knowledge or techniques in the art. The invention is not limited to the aforesaid hydrophilic groups and compounds.

Moreover, the embodiment of the invention further provides a photoresist composition 101 which comprises any aforesaid polymerizable oligomers provided by the embodiments of the invention. FIG. 1 shows the diagram of the coating process and mechanism of the photoresist composition. The photoresist composition is coated on the glass substrate 102 and exposed to light under the shielding of a mask plate 103, wherein the polymerizable oligomer in the photoresist 101 can participate in a polymerization in the presence of light and initiator. That is, the polymerizable double bond in the polymerizable oligomer will react so that the exposed portion of the photoresist 101 could not be washed off by the alkaline solution during the stage of development, thereby forming a pixel 104.

For example, the photoresist composition further comprises an alkaline soluble resin, a photoinitiator and a solvent, wherein parts by weight of the components may be: the polymerizable oligomer: 4-10; the alkaline soluble resin: 5-14.5; the photoinitiator: 1-5.5; and the solvent: 30-70.

For example, the photoresist composition may further comprise, by weight of the photoresist composition, about 0.2%-5% of an adjuvant, which may include one or more of a dispersing agent, a leveling agent and an anti-foaming agent. For example, the dispersing agent may account for about 0.2%-5% by weight of the photoresist composition, the leveling agent may account for about 0.2%-5% by weight of the photoresist composition, and the anti-foaming agent may account for about 0.1%-3% by weight of the photoresist composition. For example, the photoresist composition may further comprise, by weight of the photoresist composition, about 10%-20% of a pigment. It will be understood that, the aforesaid components such as alkaline soluble resin, photoinitiator, solvent, pigment, adjuvant and the like may be conventional materials used for preparing the photoresist composition in the art. A person skilled in the art may choose the aforesaid components and determine the level thereof based on common knowledge or common technical means.

The embodiment of the invention provides a photoresist composition comprising a polymerizable oligomer having a polymerizable double bond and a hydrophilic group. During the stage of development, the polymerizable oligomer in the photoresist composition can polymerize again via the polymerizable double bond under light, so that the exposed portion of the photoresist composition will not be washed off by an alkaline solution, whereas the unexposed portion will be washed off by the alkaline solution, thereby developing the desired pattern. Because the polymerizable oligomer bears a hydrophilic group on the side chains, the hydrophilicity of the polymerizable oligomer can be increased. After mixing with an alkaline resin to form the photoresist composition, the unexposed portion of the photoresist composition will be easily removed during the stage of development due to the hydrophilicity of the polymerizable oligomer, thus ensuring the smoothness of the photoresist surface, attenuating and mitigating the aggregation of pigments in the photoresist, and achieving an excellent development.

Figure 2:
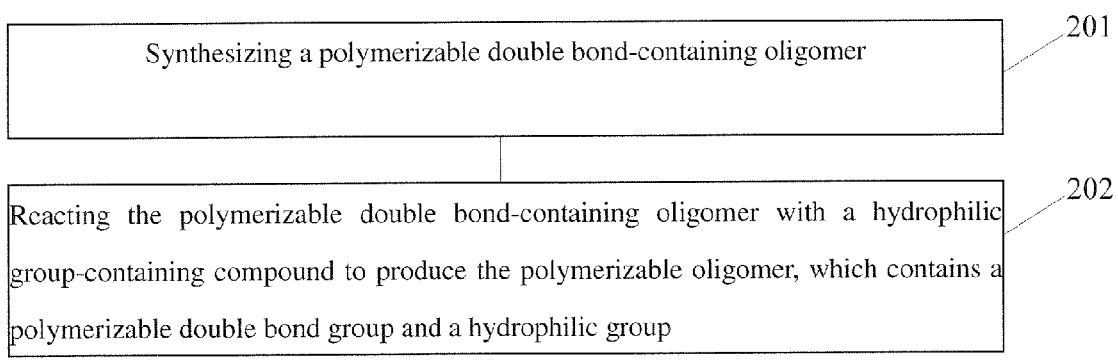
FIG. 2 is a flow chart of the process for manufacturing the polymerizable oligomer according to one embodiment of the invention.

Moreover, the embodiment of the invention further provides a process for manufacturing the polymerizable oligomer, which, as shown in FIG. 2, comprises:

201. Synthesizing the polymerizable double bond-containing oligomer;

In the step, many ways can be employed to synthesize the polymerizable double bond-containing oligomer. In the embodiment of the invention, the following two schemes are described for the synthesis of the polymerizable double bond-containing oligomer.

Scheme I

In this scheme, step 201 may comprise steps (1) and (2).

(1) One or more of a polymerizable double bond-containing organic ester monomer, a polymerizable double bond-containing organic acid monomer and a polymerizable double bond-containing organic acyl chloride monomer are polymerized to form the oligomer (a).

In step (1), one or more of a polymerizable double bond-containing organic ester monomer, a polymerizable double bond-containing organic acid monomer and a polymerizable double bond-containing organic acyl chloride monomer, as well as an initiator (or a polymerization initiator) are added in one-pot or continuously fed into the reaction vessel and reacted for 4-7 hours under a condition of 50-80° C. Then, a polymerization inhibitor is added into the reaction vessel and the temperature is reduced to 40-60° C. to yield the oligomer (a).

The initiator may be any initiator known by a person skilled in the art for the desired use. Its examples may include one or more of 2,2'-azobis-2-methylbutyronitrile, dimethyl 2,2'-azodiisobutyrate, and azodiisoheptonitrile. The polymerization inhibitor may be any polymerization inhibitor known by a person skilled in the art for the desired use, of which the examples may, for example, be one or more of hydroquinone, 2-sec-butyl-4,6-dinitrophenol, 4-t-butylcatechol, or 2,5-di-t-butylhydroquinone. Of course, the aforesaid initiators and polymerization inhibitors are only for illustration and not meant to limit the invention in any way.

(2) The oligomer (a) reacts with the compound containing a polymerizable double bond and a hydroxyl group to produce a polymerizable double bond-containing oligomer (b).

In step (2), 0.2%-1% by weight of the compound containing a polymerizable double bond and a hydroxyl group based on the total weight of the oligomer (a) is dripped into the oligomer (a) formed by polymerization in step (1) to produce the polymerizable double bond-containing oligomer (b).

Scheme II

In this scheme, step 201 may comprise:

One or more of a polymerizable double bond-containing organic ester monomer, a polymerizable double bond-containing organic acid monomer and a polymerizable double bond-containing organic acyl chloride monomer are polymerized to form the polymerizable double bond-containing oligomer (c), wherein at least one of the monomers participating in the polymerization contains two or more polymerizable double bonds. Therefore, the oligomer produced by the polymerization of such monomer contains a polymerizable double bond group which does not participate in the polymerization, forming the polymerizable double bond-containing polymer (c).

In this step, the polymerizable double bond-containing polymer (c) can be synthesized using a step identical or similar to step (1), which is not repeated here.

It will be understood that the aforesaid schemes are merely two exemplified embodiments set forth in the invention, rather than limiting the invention.

After the polymerizable double bond-containing oligomer has been synthesized using the aforesaid two schemes or other schemes, step 202 is conducted as shown in FIG. 2.

202. The polymerizable double bond-containing oligomer reacts with the hydrophilic group-containing compound to produce the polymerizable oligomer, which contains a polymerizable double bond group and a hydrophilic group.

The embodiment of the invention provides a process for manufacturing a polymerizable oligomer, which uses a polymerizable double bond-containing oligomer and a hydrophilic group-containing compound to synthesize a polymerizable oligomer bearing a hydrophilic group on the side chains. The polymerizable oligomer can increase the hydrophilicity of the negative photoresist composition upon exposure, which allows the photoresist composition to be easily removed during the stage of the development, thereby ensuring the smoothness of the photoresist composition coated surface, attenuating and mitigating the aggregation of pigments in the photoresist, and achieving an excellent development.

Moreover, the embodiment of the invention further provides a process for manufacturing a photoresist composition comprising mixing a polymerizable oligomer, an alkaline soluble resin, photoinitiator and a solvent in a proper ratio, wherein parts by weight of the components may be: the polymerizable oligomer: 4-10; the alkaline soluble resin: 5-14.5; the photoinitiator: 1-5.5 份; and the solvent: 30-70.

In order to better illustrate the aforesaid polymerizable oligomer, a photoresist composition comprising the same, and processes for manufacturing the polymerizable oligomer and the photoresist composition, several specific examples are provided below.

Example 1

The Polymerizable Oligomer and a Process for Manufacturing the Same

A 1000 mL four-necked conical flask was equipped with a nitrogen inlet, a stirrer, a heater, a condensing pipe, and a thermometer. Nitrogen gas was introduced into the conical flask. 200 parts by weight of a solvent (propylene glycol monomethyl ether acetate, PMA) was added into the four-necked conical flask and then agitated. After it was heated to 80° C. in a water bath, a monomer mixture composed of 70 parts by weight of isopentyl acrylate (the organic acrylate monomer, designated as b-1), 15 parts by weight of methacrylic acid (the organic acrylic acid monomer, designated as b-2), 20 parts by weight of acroloyl chloride (the organic acroloyl chloride monomers, designated as b-3) was added by a one-pot method. 4 parts by weight of the polymerization initiator (that is, the initiator) 2,2'-azobis-2-methylbutyronitrile (AIBN) was dissolved in PMA and divided into four aliquots, each of which was added into the four-necked conical flask with one hour interval. The reaction was conducted at 80° C. in a water bath for 4 hours to yield the polymer. The polymerization inhibitor (p-t-butylcatechol) was then added and the temperature was cooled to 40-60° C., to give the oligomer (a).

5 parts by weight of allyl alcohol (the compound containing a polymerizable double bond and a hydroxyl group, designated as b-4) and 10 parts by weight of trihydroxymethypropane ethoxide (the hydrophilic group-containing compound, designated as monomer b-5) were dropwise added to the polymer obtained from the aforesaid reaction via a constant pressure dropping funnel, and the mixture was reacted for 4 hours to give an isopentyl acrylate/methacrylic acid/acroloyl chloride terpolymer having hydroxyl, ethoxy and double bonds on the side chains. The reaction products were cooled to the room temperature, and a white powder was precipitated in a large amount of methanol/water (1:1 volume ratio) solution, which was subjected to suck filtration and dried under vacuum for 6 hours, to give the polymerizable oligomer of the example.

A Photoresist Composition and a Process for Manufacturing the Same 100 parts by weight of the polymerizable oligomer prepared in the above example, 80 parts by weight of an alkaline soluble resin (SB401, manufactured by BASF), 50 parts by weight of a photoinitiator (379, manufactured by BASF), and 160 parts by weight of pigment (C.I.254, manufactured by Jiangsu Gaoyou Adjuvant Plant) were added into 600 parts by weight of a PMA solution, agitated by a magnetic agitator to sufficiently dissolve and mix, thereby producing the photoresist composition of the example.

Example 2

The Polymerizable Oligomer and a Process for Manufacturing the Same

A process identical to that in Example 1 was employed to manufacture the polymerizable oligomer of the present example, except that parts by weight of the monomers indicated in Table 1 were employed.

The photoresist composition and a process for manufacturing the same

The photoresist composition of the present example was prepared using the polymerizable oligomer prepared in the present example with other components and the amounts thereof identical to those described in Example 1, except that the photoinitiator was the photoinitiator 369 (manufactured by BASF).

Comparable Example 1

The Polymerizable Oligomer and a Process for Manufacturing the Same

A process identical to that in Example 1 was employed to manufacture the polymerizable oligomer of the comparative example, except that parts by weight of the monomers indicated in Table 1 were employed.

The Photoresist Composition and a Process for Manufacturing the Same

The photoresist composition of the comparative example was prepared using the polymerizable oligomer prepared in the comparativet example with other components and the amounts thereof identical to those described in Example 1.

Example 3

The Polymerizable Oligomer and a Process for Manufacturing the Same

A process identical to that in Example 1 was employed to manufacture the polymerizable oligomer of the present example, except that parts by weight of the monomers indicated in Table 1 were employed.

The Photoresist Composition and a Process for Manufacturing the Same

The photoresist composition of the present example was prepared using the polymerizable oligomer prepared in the present example with other components and the amounts thereof identical to those described in Example 1.

Example 4

The Polymerizable Oligomer and a Process for Manufacturing the Same

A process identical to that in Example 1 was employed to manufacture the polymerizable oligomer of the present example, except that parts by weight of the monomers indicated in Table 1 were employed.

The Photoresist Composition and a Process for Manufacturing the Same

The photoresist composition of the present example was prepared using the polymerizable oligomer prepared in the present example with other components and the amounts thereof identical to those described in Example 1.

Comparable Example 2

The Polymer and the Preparation Thereof

A 1000 mL four-necked conical flask was equipped with a nitrogen inlet, a stirrer, a heater, a condensing pipe and a thermometer. Nitrogen gas was introduced into the conical flask. 200 parts by weight of a solvent (propylene glycol monomethyl ether acetate, PMA) was added into the four-necked conical flask and then agitated. After it was heated to 80° C. in a water bath, a monomer mixture composed of 70 parts by weight of isopentyl acrylate (b-1), 15 parts by weight of methacrylic acid (the monomer b-2), 20 parts by weight of acroloyl chloride (the monomer b-3) was added using a one-pot method. 4 parts by weight of the polymerization initiator 2,2'-azobis-2-methylbutyronitrile (AMBN) was dissolved in PMA and divided into four aliquots, each of which was added into the four-necked conical flask with one hour interval. The reaction was conducted at 80° C. in a water bath for 4 hours to give the polymer.

The Photoresist Composition and the Preparation Thereof.

100 parts by weight of the polymer prepared in the comparative example, 80 parts by weight of the alkaline soluble resin SB401, 50 parts by weight of the photoinitiator 379, and 160 parts by weight of pigment C.I.254 were added into 600 parts by weight of the PMA solution and agitated by a magnetic agitator to sufficiently dissolve and mix, thereby producing the photoresist composition of the comparative example.

TABLE 1

The monomer components and amounts thereof for synthesizing the polymerizable oligomer of Examples 1-4 and the polymer of Comparative Examples 1-2

| | Monomers and compounds for polymerization (parts by weight) | | | | | Manner of feeding | Molecular weight of the polymerizable oligomer | Viscosity of the polymerizable oligomer (mPa · S) |
|---|---|---|---|---|---|---|---|---|
| | b-1 | b-2 | b-3 | b-4 | b-5 | | | |
| Example 1 | 70 | 15 | 20 | 5 | 10 | continuous | 3000 | 800 |
| Example 2 | 60 | 25 | 10 | 5 | 0 | continuous | 2700 | 720 |
| Comparative Example 1 | 70 | 15 | 15 | 0 | 5 | continuous | 3300 | 950 |
| Example 3 | 65 | 15 | 0 | 10 | 10 | continuous | 2200 | 650 |
| Example 4 | 70 | 15 | 10 | 5 | 0 | one-pot | 3500 | 1200 |
| Comparative Example 2 | 70 | 15 | 20 | 0 | 0 | continuous | 1500 | 1100 |

The amounts of the various monomers employed for preparing the polymerizable oligomer of the examples were shown in Table 1, wherein the monomer b-1 is the organic ester monomer having a double bond, the monomer b-2 is the organic acid monomer having a double bond, the monomer b-3 is the organic acyl chloride monomer having a double bond, the monomer b-4 is the monomer having a polymerizable double bond and a hydroxyl group, and the monomer b-5 is the monomer having methoxy or ethoxy.

Performance Test (1) Development Performance Test

The negative photoresist compositions of Examples 1-4 and Comparative Examples 1-2 were each coated on a glass plate, followed by pre-baking, exposure, development, and post-baking to observe the development of each example and comparative example. The pre-baking was preformed at a temperature of 90° C. for 3 minutes. The exposure dose was 150 mJ/cm$^2$. The development was conducted using 2% NaOH solution. After the post-baking, the film thickness was 3 μm. The results for development test were set forth in Table 2, wherein ○ represents a powder, indicating that the film formed has a smooth profile.

□ represents doped with particles, indicating that the film formed has a slightly coarse profile.

x represents agglomeration, indicating that the film formed has a poor film evenness and dispersity.

As can be seen from the results shown in Table 2, the negative photoresist compositions provided by Examples 1-4 of the invention appear powder-like and exhibit an excellent development performance, as compared to the negative photoresist composition prepared from the polymer of the Comparative Example 1 that does not contain any polymerizable double bond, and of the Comparative Example 2 that does not contain any hydrophilic group on side chains.

(2) Alkaline Tolerance Test

After the aforesaid development performance test, the transmissivity of the negative photoresist compositions of Examples 1-4 and Comparative Examples 1-2 was measured with a light of a wavelength of 400-700 nm. The photoresist of each example was placed in a 2% NaOH solution for 10 minutes, and then taken out, and the transmissivity of the negative photoresist composition of each example was measured again with the aforesaid light of a wavelength of 400-700 nm. The results of the alkaline tolerance test were set forth in Table 2, wherein, ○ represents less than 5% change in transmissivity; □ represents 5%-10% change in transmissivity; and x represents more than 10% change in transmissivity.

As can be seen from the results shown in Table 2, the negative photoresist compositions provided by Examples 1-4 of the invention have less than 5% change in transmissivity and exhibit an excellent Alkaline Tolerance, as compared to the negative photoresist composition prepared from the polymer of the Comparative Example 2 that does not contain any hydrophilic group on side chains.

(3) Surface Smoothness Test

After the aforesaid development performance test, the surface smoothness of the negative photoresist compositions of Examples 1-4 and Comparative Examples 1-2 was measured using a scanning electronic microscope. The results for the smoothness test were set forth in Table 2, wherein, ○ represents smooth; □ represents a few cracks; and x represents dents and unevenness.

As can be seen from the results shown in Table 2, the negative photoresist compositions provided by Examples 1-4 of the invention have smooth surface and exhibit an excellent surface smoothness, as compared to the negative photoresist composition prepared from the polymer of the Comparative Example 1 that does not contain any polymerizable double bond, and of the Comparative Example 2 that does not contain any hydrophilic group on side chains.

TABLE 2

Testing results of the performance of the photoresist compositions of Examples 1-4 and Comparative Examples 1-2

|  |  | Example | | | | Comparative Example | |
|---|---|---|---|---|---|---|---|
|  |  | 1 | 2 | 3 | 4 | 1 | 2 |
| Evaluation | Development | ○ | ○ | ○ | ○ | □ | ○ |
|  | Alkaline Tolerance | ○ | ○ | ○ | ○ | ○ | □ |
|  | Surface Smoothness | ○ | ○ | ○ | ○ | □ | x |

The aforesaid contents are merely specific embodiments of the invention, not intended to limit the scope of the invention. All variations or substitutions easily conceivable by a person skilled in the art in light of the technical disclosure of the invention will fall into the scope of the invention. Thus, the protection scope of the present invention will be determined by the appended claims.

The invention claimed is:

1. A polymerizable oligomer comprising a polymerizable double bond and a hydrophilic group, wherein the monomers or compounds for the synthesis of the polymerizable oligomer are: one or more of a polymerizable double bond-containing organic ester monomer, a polymerizable double bond-containing organic acid monomer, and a polymerizable double bond-containing organic acyl chloride monomer; a compound containing a polymerizable double bond and a hydroxyl group; and a hydrophilic group-containing compound,
    wherein the polymerizable oligomer is prepared from an oligomer (a), the compound containing a polymerizable double bond and a hydroxyl group, and a the hydrophilic group-containing compound;
    wherein the oligomer (a) is polymerized from the polymerizable double bond-containing organic ester monomer, the polymerizable double bond-containing organic acid monomer and the polymerizable double bond-containing organic acyl chloride monomer, in which parts by weight of each monomer are
    the organic ester monomer: 6;
    the organic acid monomer: 1-3; and
    the organic acyl chloride monomer: 3-1.

2. The polymerizable oligomer according to claim 1, wherein the compound containing a polymerizable double bond and a hydroxyl group is selected from allyl alcohol, hydroxyethyl acrylate, hydroxyethyl methacrylate, hydroxypropyl acrylate or hydroxypropyl methacrylate.

3. The polymerizable oligomer according to claim 1, wherein the hydrophilic group-containing compound is one or more of a methoxy-containing compound, an ethoxy-containing compound and a hydroxyl-containing compound.

4. The polymerizable oligomer according to claim 3, wherein the methoxy-containing compound is one or more of N,N-diethyl-3-aminopropyltriethoxysilane, 3-aminopropyltrimethoxysilane and bis(3-trimethoxysilylpropyl)amine.

5. The polymerizable oligomer according to claim 3, wherein the ethoxy-containing compound is one or more of dimethyldiethoxysilane, o-ethoxybenzoyl chloride, diethoxymethane, ethoxydiglycol, tetraethoxypropane, aminopropyltriethoxysilane, 3-aminopropylmethyldiethoxysilane, and N,N-bis(3-chloro-2-hydroxypropyl)aminopropyltriethoxysilane.

6. The polymerizable oligomer, according to claim 3, wherein the hydroxyl-containing compound is selected from pentaerythritol, hexylene glycol, or and the combination thereof.

7. The polymerizable oligomer according to claim 1, wherein the polymerizable double bond-containing organic ester monomer includes an acrylate monomer.

8. The polymerizable oligomer according to claim 7, wherein the acrylate monomer is one or more of methyl acrylate, methyl methacrylate, ethyl methacrylate, propyl methacrylate, butyl methacrylate, isobutyl methacrylate, and isopentyl acrylate.

9. The polymerizable oligomer according to claim 1, wherein the polymerizable double bond-containing organic acid monomer includes an acrylic acid monomer.

10. The polymerizable oligomer according to claim 9, wherein the acrylic acid monomer is one or more of acrylic acid, methacrylic acid, crotonic acid, cinnamic acid and α-methylcinnamic acid.

11. The polymerizable oligomer according to claim 1, wherein the polymerizable double bond-containing organic acyl chloride monomer includes an acroloyl chloride monomer.

12. The polymerizable oligomer according to claim 11, wherein the acroloyl chloride monomer is one or more of methacroloyl chloride, 2-ethylacroloyl chloride, acroloyl chloride and isobutylacroloyl chloride.

13. A photoresist composition comprising the polymerizable oligomer according to claim 1.

14. The photoresist composition according to claim 13, wherein the photoresist composition further comprises an alkaline soluble resin, a photoinitiator, and a solvent; wherein parts by weight of each component are
    the polymerizable oligomer: 4-10;
    the alkaline soluble resin: 5-14.5;
    the photoinitiator: 1-5.5; and
    the solvent: 30-70.

15. The photoresist composition according to claim 14, wherein the photoresist composition further comprises, by weight of the photoresist composition, 0.2%-5% of an adjuvant, which includes one or more of a dispersing agent, a leveling agent and an anti-foaming agent.

16. A process for preparing the polymerizable oligomer according to claim 1 comprising:
    synthesizing a polymerizable double bond-containing oligomer; and
    reacting the polymerizable double bond-containing oligomer with a hydrophilic group-containing compound to produce the polymerizable oligomer,
    wherein the polymerizable oligomer comprises a polymerizable double bond and a hydrophilic group.

17. The process according to claim 16, wherein the synthesizing a polymerizable double bond-containing oligomer comprises:
    polymerizing one or more of a polymerizable double bond-containing organic ester monomer, a polymerizable double bond-containing organic acid monomer, and a polymerizable double bond-containing organic acyl chloride monomer to form an oligomer (a); and
    reacting the oligomer (a) with a compound containing a polymerizable double bond and a hydroxyl group to produce the polymerizable double bond-containing oligomer.

18. The process according to claim 16, wherein the synthesizing a polymerizable double bond-containing oligomer comprises:

polymerizing one or more of a polymerizable double bond-containing organic ester monomer, a polymerizable double bond-containing organic acid monomer, and a polymerizable double bond-containing organic acyl chloride monomer to form a polymerizable double bond-containing oligomer, wherein at least one of the monomers participating in the polymerization contains two or more polymerizable double bonds, and at least one polymerizable double bond in the monomer that contains two or more polymerizable double bonds participates in the polymerization and at least one polymerizable double bond in the monomer does not participate in the polymerization.

19. A polymerizable oligomer comprising a polymerizable double bond and a hydrophilic group, wherein the monomers or compounds for the synthesis of the polymerizable oligomer are one or more of a polymerizable double bond-containing organic ester monomer, a polymerizable double bond-containing organic acid monomer, and a polymerizable double bond-containing organic acyl chloride monomer; and a hydrophilic group-containing compound,
wherein the polymerizable oligomer is prepared from a polymerizable double bond-containing oligomer (c) and the hydrophilic group-containing compound;
wherein the polymerizable double bond-containing oligomer (c) is polymerized from one or more of the polymerizable double bond-containing organic ester monomer, the polymerizable double bond-containing organic add monomer and the polymerizable double bond-containing organic acyl chloride monomer, wherein at least one of the monomers participating in the polymerization contains two or more polymerizable double bonds, and at least one polymerizable double bond in the monomer that contains two or more polymerizable double bonds participates in the polymerization and at least one polymerizable double bond in the monomer does not participate in the polymerization.

* * * * *